US010269997B2

(12) United States Patent
Chintada

(10) Patent No.: US 10,269,997 B2
(45) Date of Patent: Apr. 23, 2019

(54) SYSTEM AND METHOD OF TRANSPARENT PHOTOVOLTAIC SOLAR CELLS AS TOUCH SCREEN SENSORS AND SOLAR ENERGY SOURCES

(71) Applicant: Latavya Chintada, Gilbert, AZ (US)

(72) Inventor: Latavya Chintada, Gilbert, AZ (US)

(*) Notice: Subject to any disclaimer, the term of this patent is extended or adjusted under 35 U.S.C. 154(b) by 245 days.

(21) Appl. No.: 14/978,074

(22) Filed: Dec. 22, 2015

(65) Prior Publication Data

US 2016/0110026 A1 Apr. 21, 2016

(51) Int. Cl.
*G06F 3/042* (2006.01)
*H01L 31/04* (2014.01)
*H01L 31/044* (2014.01)

(52) U.S. Cl.
CPC .............. *H01L 31/04* (2013.01); *G06F 3/042* (2013.01); *H01L 31/044* (2014.12); *G06F 2203/04104* (2013.01); *Y02E 10/50* (2013.01)

(58) Field of Classification Search
CPC ....................................................... H01L 31/04
See application file for complete search history.

(56) References Cited

U.S. PATENT DOCUMENTS

| | | | |
|---|---|---|---|
| 3,482,241 A | 12/1969 | Aurther et al. | |
| 3,662,105 A | 5/1972 | Hurst et al. | |
| 7,479,949 B2 | 1/2009 | Jobs et al. | |
| 2010/0245731 A1* | 9/2010 | Limketkai | G02B 5/201 349/106 |
| 2010/0258361 A1* | 10/2010 | Yamauchi | G06F 3/044 178/18.06 |
| 2012/0103384 A1* | 5/2012 | Hsieh | G06F 3/038 136/244 |
| 2013/0143349 A1* | 6/2013 | Hong | H01L 31/022433 438/71 |
| 2014/0049116 A1* | 2/2014 | Suzuki | G06F 1/28 307/78 |
| 2015/0070024 A1* | 3/2015 | Kim | G01R 31/3679 324/430 |
| 2015/0199062 A1 | 7/2015 | Lang | |
| 2016/0098115 A1* | 4/2016 | Ren | H01L 31/02325 345/174 |

OTHER PUBLICATIONS

Oswald, Tom & Lunt, Richard, "Solar Energy That Doesn't Block the View," Michigan State University, Aug. 14, 2014, p. 1.*
Lunt, Richard R., and Vladimir Bulovic. "Transparent Near-infrared Organic Photovoltaic Solar Cells for Window and Energy-scavenging Applications." Applied Physics Letters 98.11 (2011).

* cited by examiner

*Primary Examiner* — Amr A Awad
*Assistant Examiner* — Maheen I Javed
(74) *Attorney, Agent, or Firm* — Michelle L. Gross, P.C.

(57) ABSTRACT

A method of creating a touch sensitive surface comprising detecting a voltage change in a light sensitive voltage generating device from among an array of light sensitive voltage generating devices that comprise a touch sensitive surface, in response to a lack of energy within a non-visible light spectrum reaching the light sensitive voltage generating device when a user contacts the touch sensitive surface, generating one or more location coordinates corresponding to a location in the array at which the voltage change occurred, and transmitting the one or more location coordinates to a processor configured to process a touch command received by the touch sensitive surface.

14 Claims, 7 Drawing Sheets

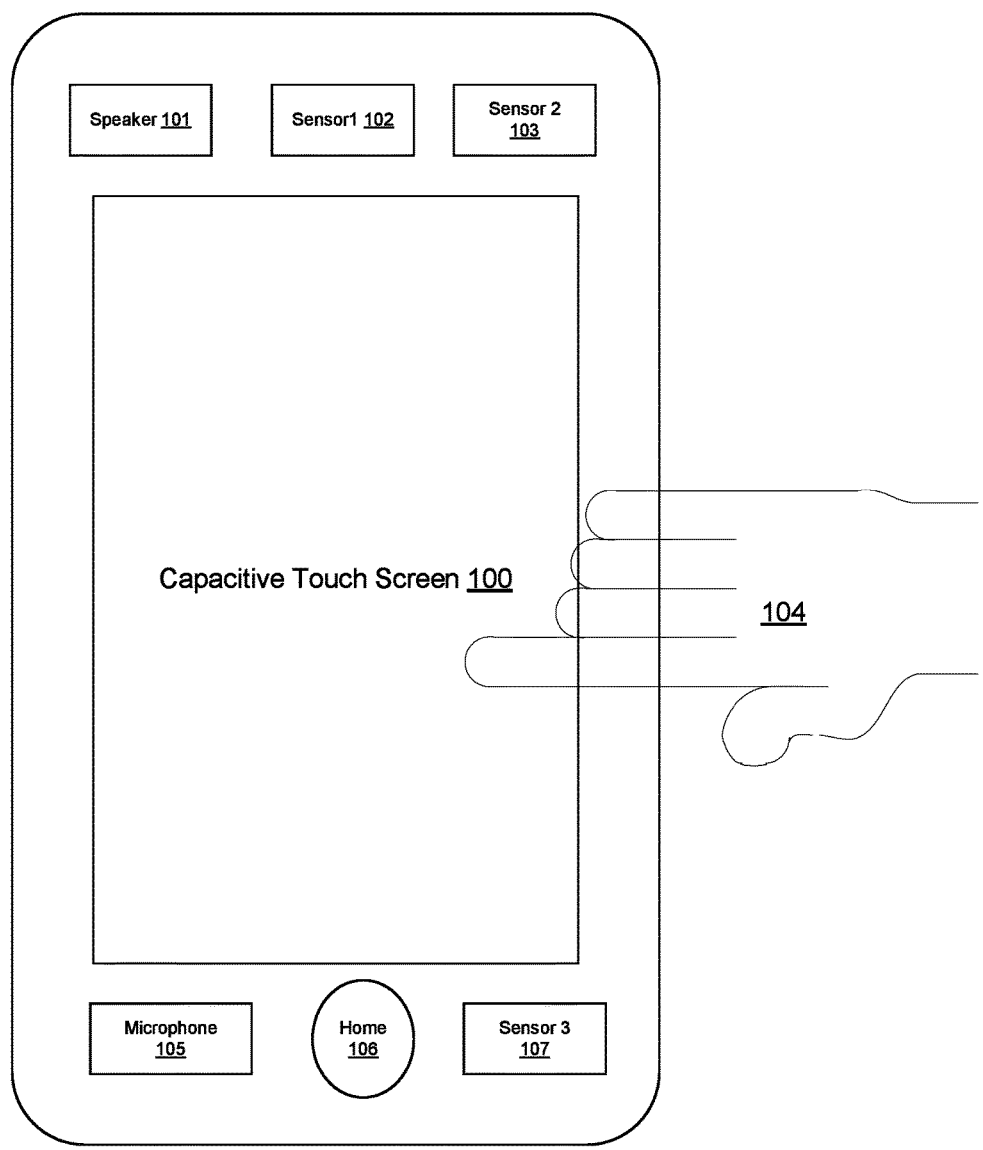
FIG. 1 – PRIOR ART

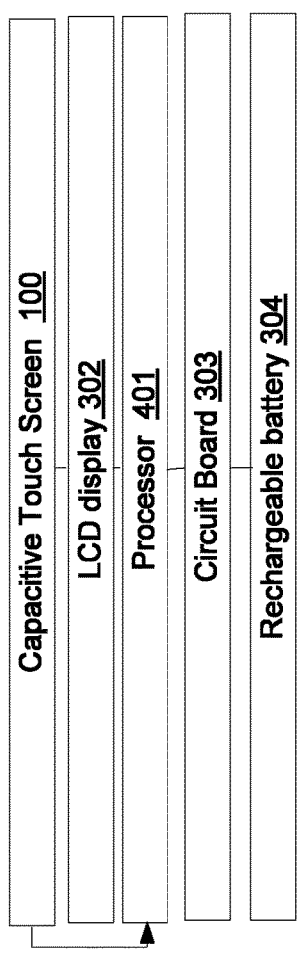
FIG. 2 – PRIOR ART
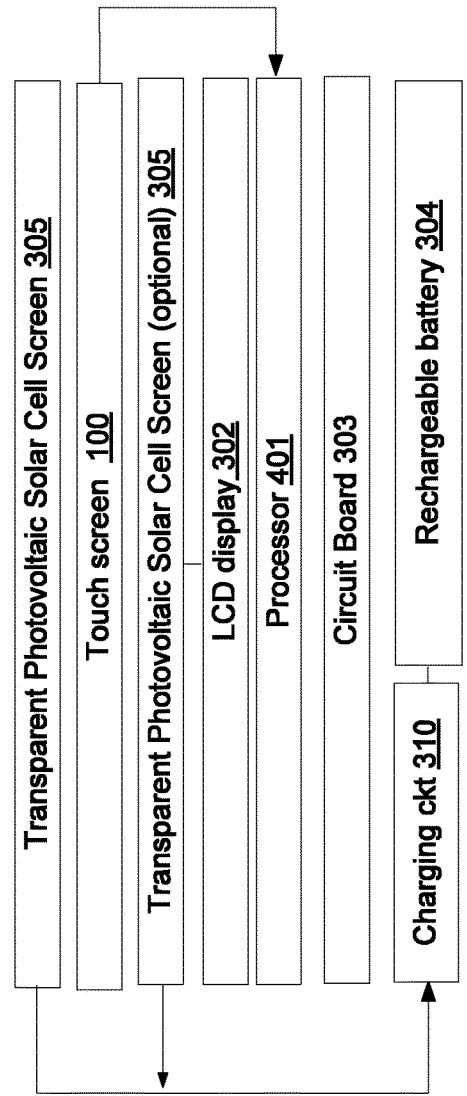
FIG. 3 – PRIOR ART

SYSTEM AND METHOD OF TRANSPARENT PHOTOVOLTAIC SOLAR CELLS AS TOUCH SCREEN SENSORS AND SOLAR ENERGY SOURCES

BACKGROUND

1. Technical Field

Aspects of this document relate generally to touch sensors, transparent solar cells, and dual mode devices.

2. Background Art

This relates generally to smart devices that require alternative energy to power them for maximum availability and decrease environmental issues that are caused by conventional power generation, alternative to capacitance based touch screens for operational purposes in hygienic environments such as hospitals, and alternative to generating low cost touch sensitive devices for large screen devices like TVs, and other huge display devices.

Today's traditional touch screen devices use capacitance based touch technology, hence it requires an exposed finger or a thin glove to touch the screen directly for capacitance to form, making the touch screen work. However, such requirements cause bacterial growth and infection in sensitive fields such as hospitals. Therefore, such areas require the smart devices to operate using gloves to mitigate the hygienic issues. These capacitance-based touch screens are also expensive to make, especially for large screen devices like TVs and monitors, The recent novelty of transparent solar cells can be used for alternative energy sources for smart devices, however these transparent solar screens, placed either in between graphical display and touch screen or on top of the touch screen, only provide alternative energy by adding one more layer of complexity to the existing devices. Although this is the case, these transparent solar screens are very cheap to manufacture compared to traditional capacitance based touch screens.

So as to reduce the length and complexity of the detailed description and fully establish the state of the current art, Applicant hereby incorporates the following documents by reference in their entirety:
U.S. Pat. No. 3,482,241 to Aurther et al.
U.S. Pat. No. 3,662,105 to Hurst, et al.
U.S. Pat. No. 7,479,949 to Jobs et al.
U.S. Publication No. 20150199062 to Lang.
U.S. Publication No. 20148730179 to Rosenblatt et al.
Lunt, Richard R., and Vladimir Bulovic. "Transparent Near-infrared Organic Photovoltaic Solar Cells for Window and Energy-scavenging Applications." Applied Physics Letters 98.11 (2011).

SUMMARY

Implementations of a method of creating a touch sensitive surface may comprise detecting a voltage change in a light sensitive voltage generating device from among an array of light sensitive voltage generating devices that comprise a touch sensitive surface, in response to a lack of energy within a non-visible light spectrum reaching the light sensitive voltage generating device when a user contacts the touch sensitive surface. The method may further comprise generating one or more location coordinates corresponding to a location in the array at which the voltage change occurred and transmitting the one or more location coordinates to a processor configured to process a touch command received by the touch sensitive surface.

Particular aspects may comprise one or more of the following features. The array of light sensitive voltage generating devices may be comprised of photovoltaic devices. The photovoltaic devices may comprise transparent photovoltaic solar cells. The touch sensitive surface may be located on a handheld computerized device. The lack of energy within the non-visible light spectrum reaching the light sensitive voltage generating device may be caused by an obstruction of light by at least one of a digit of a user's hand, a stylus, or a glove.

Implementations of a touch sensitive surface may comprise a plurality of touch sensitive voltage varying devices (VVD) configured to form a grid, a voltage detector configured to measure a change in a voltage of one or more touch areas on the grid when a user touches the touch sensitive surface, and a processor configured to calculate an average voltage of each VVD and process a touch command received by the touch sensitive surface in response to a voltage drop in a touch area of the grid that corresponds with a location of the touch area in which the voltage drop occurred.

Particular aspects may comprise one or more of the following features. At least one of the VVD's may change voltage without an external voltage or current being applied. The VVD's may be analog or digital electrical circuits that measure absolute voltage. The average voltage produced by each VVD may be based on current input energy and is used as a threshold voltage below which the voltage drop in the touch area must fall for the processor to determine one or more location coordinates corresponding to the location of the touch area in which the voltage drop occurred. The VVD's may be transparent photovoltaic solar cells that are configured to receive input energy from a solar or synthetic light energy source. At least a portion of the plurality of VVD's may remain operational in the event of a failure of one or more VVD's among the plurality of VVD's.

Implementations of a touch sensitive surface may comprise a plurality of touch sensors configured in an array, a voltage detector configured to detect a voltage change at a location in the array that is caused by a user touching the touch sensitive surface, and a processor configured to calculate one or more location coordinates corresponding to the location in the array in response to the voltage change detected and process a touch command corresponding to the location in the array associated with the one or more location coordinates. The touch sensitive surface may further comprise a recharging circuit configured to recharge a battery coupled to the recharging circuit using voltages produced by the touch sensors and a unidirectional device configured to prevent backward current flow from adjacent touch sensors resulting from the voltage drop at the location in the array corresponding to the one or more location coordinates.

Particular aspects may comprise one or more of the following features. The touch sensors may comprise transparent photovoltaic solar cells. The unidirectional device may comprise a diode. The plurality of transparent photovoltaic solar cells is electrically connected in at least one of a parallel and series configuration such that total current and voltage outputs are greater than a current and voltage output of a single transparent photovoltaic solar cell. The touch sensitive surface may further comprise a combiner circuit configured to combine voltages produced by the plurality of transparent photovoltaic solar cells in such that energy continues to be generated in the event of a failure of a transparent photovoltaic solar cell in the array. At least one of a digit of a user's hand, a stylus, or a glove may be used to touch the touch sensitive surface. The voltage change may occur without an external voltage or current being applied. The processor may be further configured to calculate an average voltage among the plurality of touch sensors against which a voltage of an individual touch sensor is compared to determine whether a user has touched the touch sensitive surface.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventor is fully aware that she can be her own lexicographer if desired. The inventor expressly elects, as her own lexicographer, to use only the plain and ordinary meaning of terms in the specification and claims unless she clearly states otherwise and then further, expressly sets forth the "special" definition of that term and explains how it differs from the plain and ordinary meaning. Absent such clear statements of intent to apply a "special" definition, it is the inventor's intent and desire that the simple, plain and ordinary meaning to the terms be applied to the interpretation of the specification and claims.

The inventor is also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventor is fully informed of the standards and application of the special provisions of post-AIA 35 U.S.C. § 112(f). Thus, the use of the words "function," "means" or "step" in the Description, Drawings, or Claims is not intended to somehow indicate a desire to invoke the special provisions of post-AIA 35 U.S.C. § 112(f), to define the invention. To the contrary, if the provisions of post-AIA 35 U.S.C. § 112(f) are sought to be invoked to define the claimed disclosure, the claims will specifically and expressly state the exact phrases "means for" or "step for, and will also recite the word "function" (i.e., will state "means for performing the function of [insert function]"), without also reciting in such phrases any structure, material or act in support of the function. Thus, even when the claims recite a "means for performing the function of . . ." or "step for performing the function of . . . ," if the claims also recite any structure, material or acts in support of that means or step, or that perform the recited function, then it is the clear intention of the inventors not to invoke the provisions of post-AIA 35 U.S.C. § 112(f). Moreover, even if the provisions of post-AIA 35 U.S.C. § 112(f) are invoked to define the claimed disclosure, it is intended that the disclosure not be limited only to the specific structure, material or acts that are described in the preferred embodiments, but in addition, include any and all structures, materials or acts that perform the claimed function as described in alternative embodiments or forms of the invention, or that are well known present or later-developed, equivalent structures, material or acts for performing the claimed function.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 1 provides an example of a computerized device comprising a capacitive multi-touch sensor panel as known in the prior art.

FIG. 2 provides a block diagram of an assembly of a touch screen, LCD display, circuit board, and rechargeable battery as known in the prior art.

FIG. 3 provides a block diagram of a prior art assembly of a transparent solar screen for alternative energy sources which recharges the battery in conjunction with a touch screen, LCD display and circuit board.

DESCRIPTION

Figure 4:
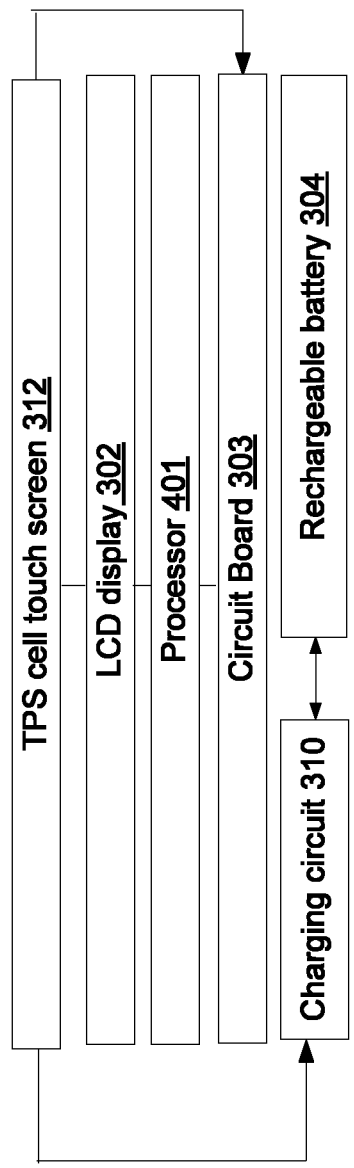
FIG. 4 is a block diagram of an implementation of a TPS cell touch sensitive screen and alternative energy battery recharging source in accordance with an implementation of the system and methods disclosed herein.
Figure 5:
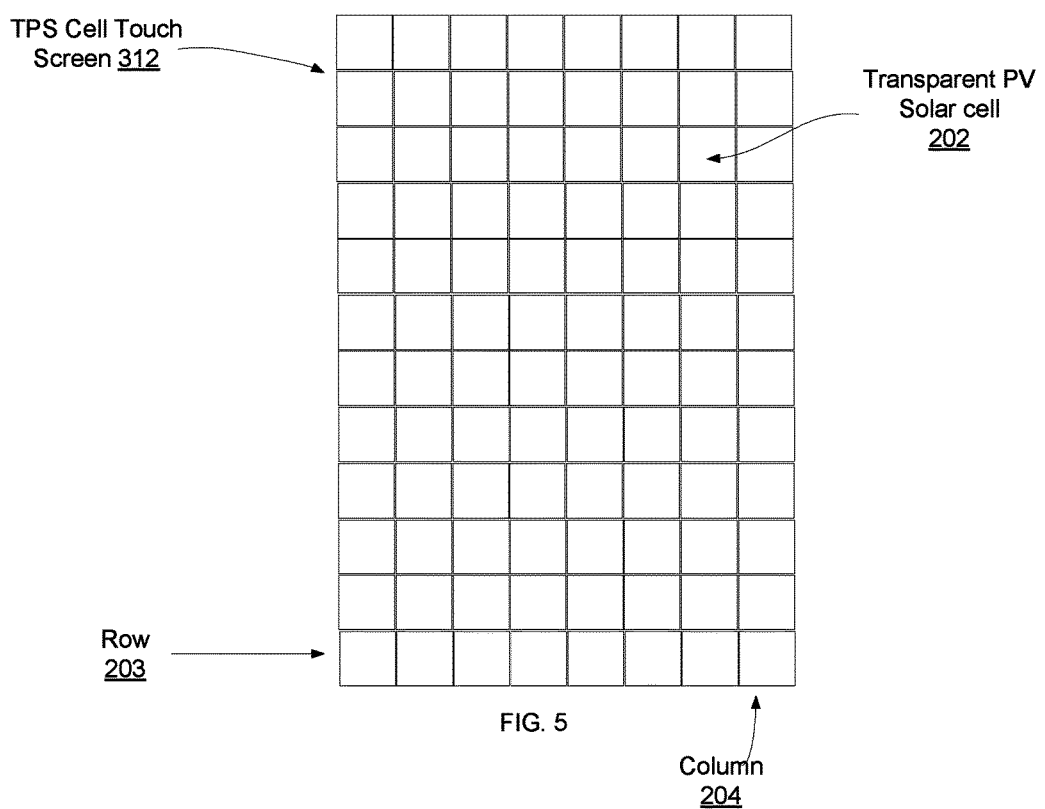
FIGS. 5-6 provide exemplary implementations of an array configuration of a TPS cell touch sensitive screen.

This disclosure, its aspects and implementations, are not limited to the specific components, configurations or methods disclosed herein. Many additional components and assembly procedures known in the art consistent with touch sensitive surfaces such as touch sensitive screens for computerized devices are in use with particular implementations from this disclosure. Accordingly, for example, although particular implementations are disclosed, such implementations and implementing components may comprise any components, models, versions, quantities, and/or the like as is known in the art for such systems and implementing components, consistent with the intended operation.

The implementations of this disclosure generally relate to transparent photovoltaic solar cells being used as touch sensors forming touch sensitive surfaces or screens for use in computerized devices such as handle held devices, televisions, monitors, etc. Some implementations disclosed herein may comprise transparent photovoltaic solar (TPS) cell-based touch sensors used in conjunction with transparent solar cells. Transparent solar screens comprised of TPS cells may coexist with traditional touch screens as an alternative way to charge the batteries of the device of which the solar screen is a part. Presently, in the prior art, both existing touch screens and TPS cells may be stacked in a complex configuration to fully utilize the existing touch screen technology and to utilize the maximum solar energy. However, these prior implementations still suffer from the limitations of traditional touch screen technologies such as the inability to use safety gloves in a medical setting or other clean-room environment as well as a considerable cost associated with use for large screen devices.

Touch screen technologies were first developed around 1969 and are now serve as popular user interfaces for hand held devices like cellphones, tablets, media players, ATM's, and self-service terminals in retail stores and airports. All of these presently existing devices use different touch screen technologies including analog resistive, surface capacitive, projected capacitive, surface acoustic wave, infrared and optical technology. On handheld devices and tablets, however, capacitive touchscreens have emerged as the main technology. FIG. 1 provides an example of a typical handheld device as known in the prior art having a capacitive touch screen 100 which is receptive only to an exposed body part such as the hand of a user 104 in order to receive a touch command from the screen 100. Handheld devices also commonly have other, nonessential elements such as a speaker 101, microphone 105, home button 106, and various sensors, 102, 103, 107.

Capacitive touch screens 100 operate based on a simple capacitor principal that comprised of two electrodes sandwiched with dielectric material that measure a change in capacitance. The capacitive touch screen is comprised of an array of conductive electrodes forming a layer of electrodes and a transparent, insulating glass layer used as a dielectric material. The other electrode is introduced in the form of a touch of a person's finger to the dielectric layer. When the user touches the screen, the newly formed capacitance with the user's body capacitance causes a change in overall capacitance that is detected by internal touch detection circuit 303 that sends the signal to the touch screen controller to find the x-y coordinates of the touched area. As shown in FIG. 2, the capacitive touch screen 100 may be coupled to an LCD display 302. Capacitive touch screens 100 provide more accurate touch areas than other touch screens in the prior art, and in order to avoid being susceptible to noise, the lower electrode is supplied with constant voltage that consumes power. These capacitance touch screens are disadvantageous in that they are sensitive to EMI/RMI interface, only work with an exposed finger or very thin surgical gloves, and while the device may have a rechargeable battery 304, capacitive touch screens 100 still consume a significant amount of power.

Previously existing light technology such as infrared (IR) touch screens, which use IR emitters and monitors on the display screen to create an invisible grid of light beams across the screen. When an object or a finger touches the screen, it interrupts the light beam that will be detected by the monitors and passes the x-y coordinates of touch area. This technology continually generates light beams which results in a high level of power consumption and resulting cost as well as the disadvantage of increased sensitivity to ambient light.

As shown in FIG. 3, the more recently developed transparent photovoltaic solar (TPS) cells can be arranged as a screen 305 and used for alternative energy sources for smart devices, however these TPS cell screens 305, placed either in between an LCD graphical display 302 and a capacitive touch screen 100 or on top of the touch screen 100, only provide alternative energy by adding one more layer of complexity to the existing devices. These devices commonly contain a charging circuit 310 coupled to a rechargeable battery 304 and utilize the energy received by the TPS cell screens 305 to recharge the battery. TPS cell screens offer the advantage of being inexpensive compared to traditional capacitive touch screens and thus, do not add significantly to the overall cost of the device in which they are implemented.

Implementations of the systems and methods disclosed herein that rely on the use of touch sensitive voltage varying devices (VVDs) such as for example, TPS cells, as touch sensors overcome the disadvantages of the prior art in accordance with the following exemplary configurations and implementations which eliminate the need for a separate, capacitive or IR touch screen in the device through the use of a TPS cell touch screen as shown in FIG. 4.

TPS cells 202 may be arranged in an array fashion, such as, for example, a grid comprised of rows 203 and columns 204. This resulting structure forms the framework for the TPS cell touch screen. The TPS cells 202 produce a voltage due to exposure to incandescent light either from solar or any source of synthetic light. TPS cells 202 produce a higher voltage when more light falls on the cell or a lower voltage or no voltage when the light is obstructed blocked by either a user, such as for example, a user's finger regardless of whether the user's body part that is obstructing the light is exposed of cloaked in an article of clothing such as a glove. A voltage detector 400 measures the voltage of the TPS cells 202 and compares these voltages with other relative TPS cell voltages. In some implementations, one voltage detector 400 may be used per TPS cell 202 and in some implementations, the voltage detector 400 may be configured as an analog or digital circuit which may measure the absolute voltage. The voltage detector may use an average voltage produced by each VVD based on the present input energy as a threshold voltage below which a voltage drop in a touch area must fall in order for the processor 401 to determine one or more location coordinates of the area.

If the voltage detector 400 finds a drop of voltage(s), the voltage detector 400 then determines and sends one or more location coordinates 410, such as for example, two dimensional x-y coordinates, of the one or more cells that have experienced a voltage drop to a processor 401 that executes processing of a touch command 420 associated with the location at which the voltage drop occurred. The same technique may be used to sense and process multiple touches. It is intended that this change in voltage is due to the obstruction of light reaching the TPS cell resulting from a user's body part, such as a finger obstructing the light when a user touches the screen to select a touch command option and is not due to the application of an external voltage or current.

Figure 8:
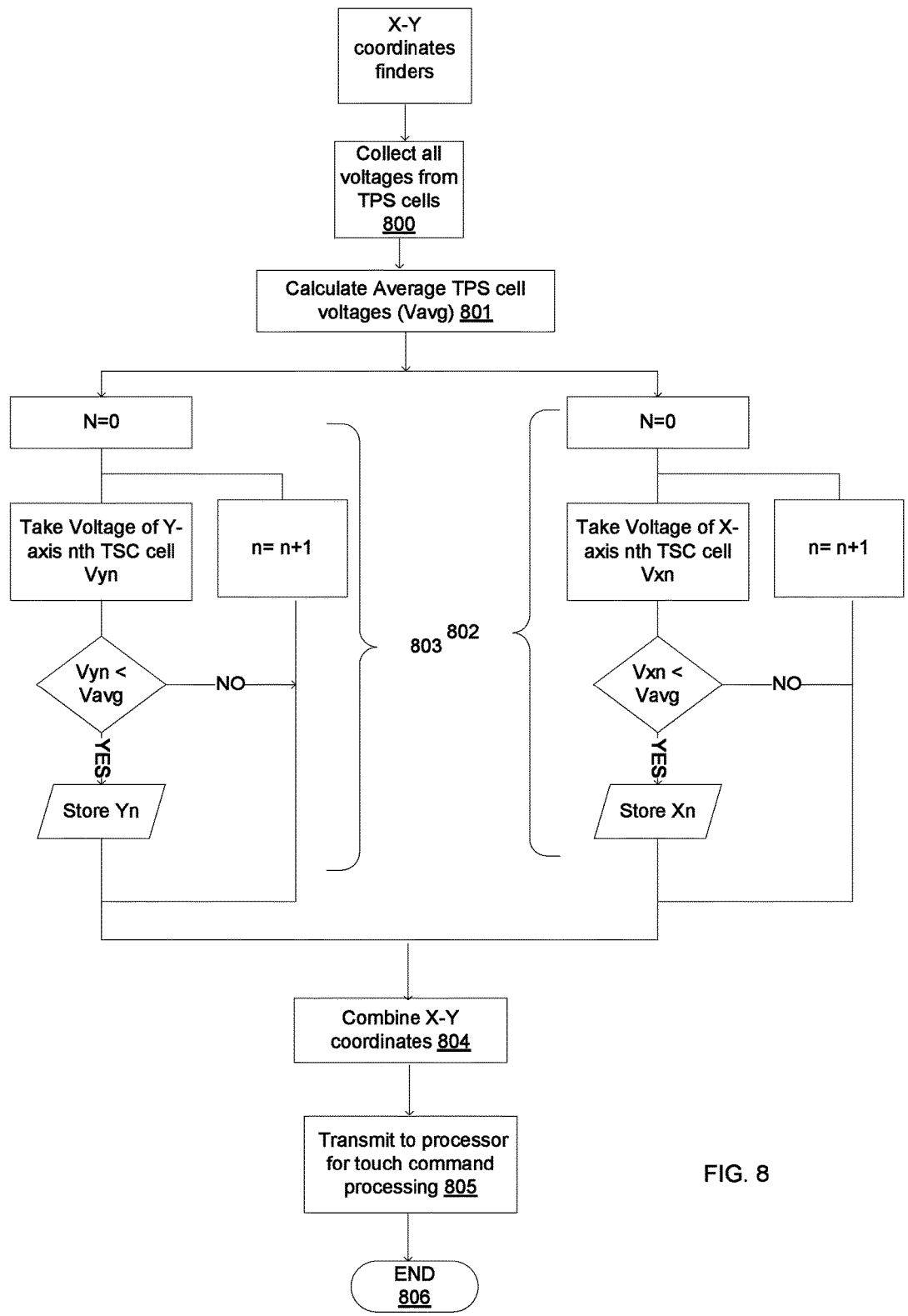
FIG. 8 is a block diagram of a method of location coordinate detection and calculation in accordance with the systems and methods disclosed herein.

Unlike capacitance based touch sensors, the voltage based touch sensors that use the TPS cells in accordance with this disclosure require running an algorithm to accurately calculate one or more location coordinates at which the touch and resulting voltage drop occurred while accounting for a change in ambient light or malfunctioning cells. Malfunctioning cells may result in a voltage drop which should not falsely detect the touch area and it is intended that at least a portion of the TPS cells continue to function normally in the event of a failure or malfunction of one or more other TPS cells. This may be accomplished through the use of a combiner circuit or any other appropriate methodology. FIG. 8 provides a flow diagram showing an exemplary implementation of a method for calculating x-y coordinates 410 corresponding to the location at which a TPS cell receives a touch from a user in accordance with the following steps:

Step 1 (800): Collect all TSC cells voltage levels.
Step 2 (801): Calculate average voltage $$V_{avg} = \frac{V1 + V2 + V3 + V4 + \ldots , V_n}{n}$$

Step 3: Run two or more individual process to calculate X coordinates and Y-coordinates separately
Step 4 (802): X coordinate calculation by measuring 0<Vxn<Xavg and store xn value
Step 5 (803): Similarly calculate 0<Vyn<Xavg and store yn value
Step 6 (804): Combine xn and yn format the co-ordinates Step 7 (805): Send it touch command process.

Step 8 (806): Done

The calculation of the average voltage in step 2 above may serve to minimize or eliminate the impact of varying light conditions or a malfunctioning or malformed TPS cell by using the calculated average voltage across at least a plurality of TPS cells rather than a single TPS cell for comparison to determine whether a voltage drop exceeding a predetermined threshold has been met and therefore, one or more location coordinates should be calculated in response to a user initiating a touch command.

In some implementations, the processor 401 can scan or measure some or all TPS cell voltages during an ideal time, such as for example, during a period in which a high level of ambient light is present. This continued scanning and/or measuring may be used to identify one or more malformed or malfunctioning TPS cells by monitoring and determining whether a voltage drop has occurred at one or more x-y coordinate locations for a longer duration than would be typical of a user intentionally executing a touch command. For the purpose of x-y coordinate determination and processing, this voltage drop can then be ignored and the malfunctioning or malformed TPS cell may be identified. In an area having a greater number of TPS cells per square unit, susceptibility to malformed or malfunctioning TPS cells is therefore greater.

Figure 6:
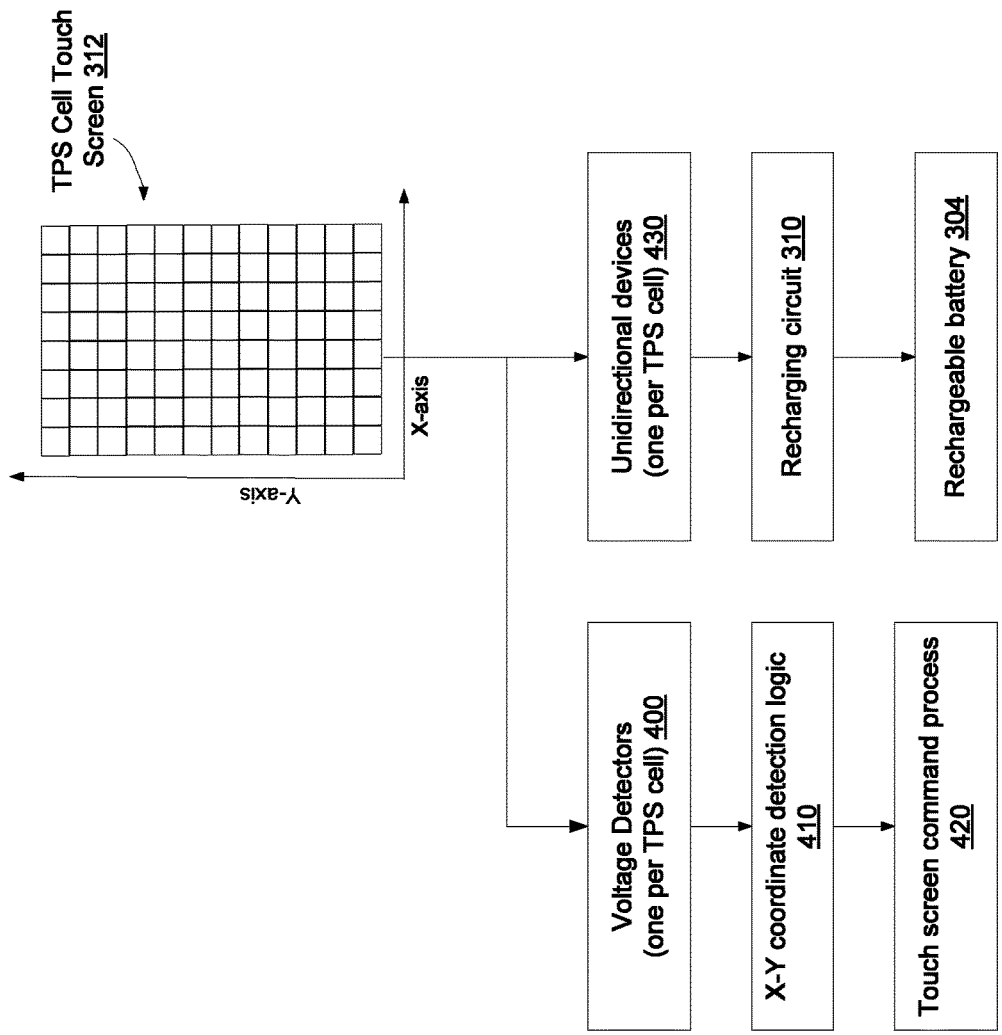
Figure 7:
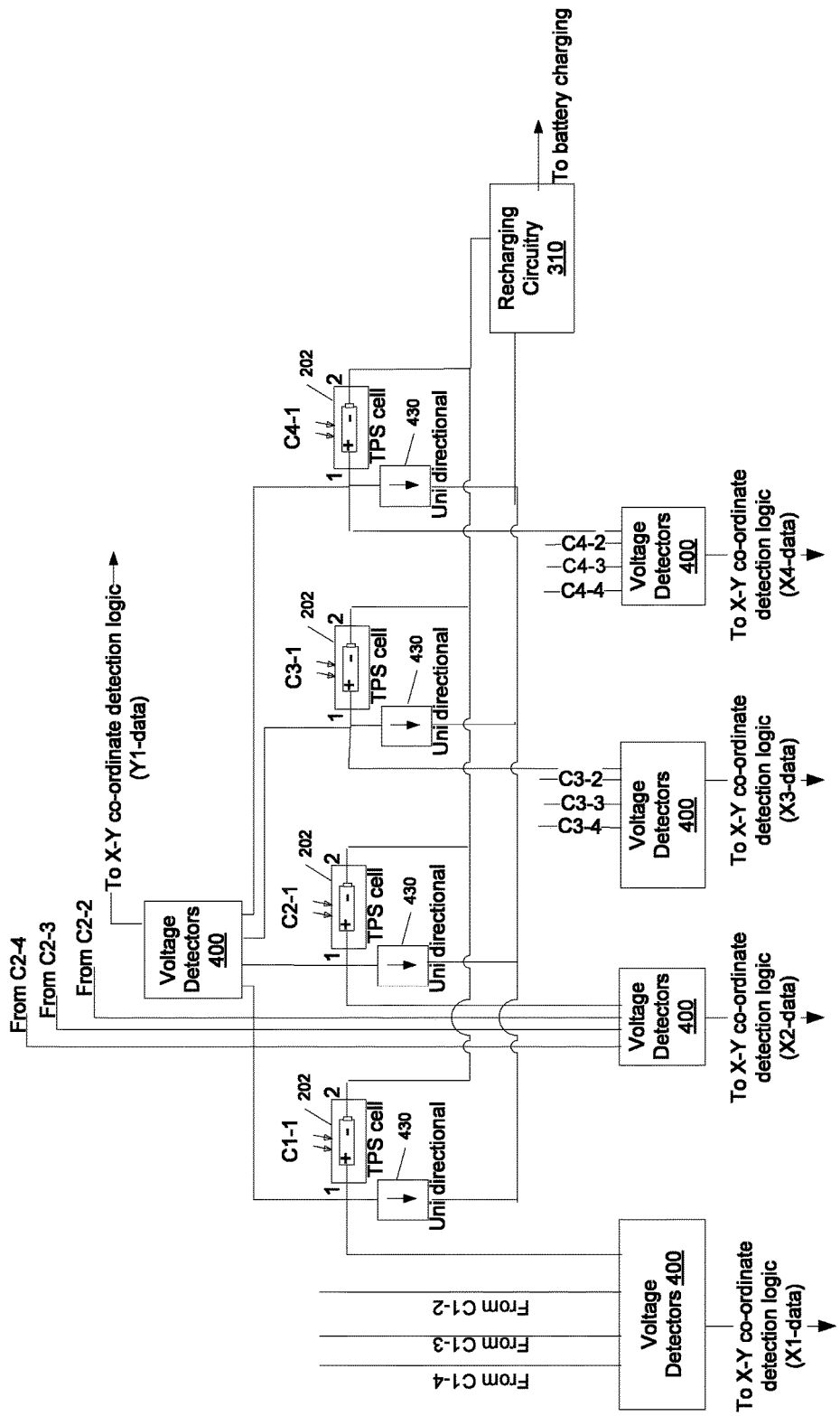
FIG. 7 is a block diagram of a touch detection and recharging circuit which may form a part of an array or matrix configuration.

In some implementations, each TPS cell 202 in a row 203 or column 204 are connected in parallel or series using unidirectional devices 430, as shown in FIGS. 6-7, to maximize the current output generated by each TPS cell 202. That output is then fed to a battery charging circuit 310 which is used to charge a rechargeable battery 304. The unidirectional devices 430, which may be diodes, are used to stop backward flow of current from neighboring TPS cells 202 or from the rechargeable battery 304 to the TPS voltage detectors 400, to avoid false voltage detection. FIG. 7 provides a block diagram of a portion of a four by four array of TPS cells as an exemplary configuration, however, any sized array or appropriate configuration may also be used in accordance with the systems and methods disclosed herein. In some implementations, the TPS cells may be electrically connected in parallel or series such that the total current and voltage outputs of the array of cells is greater than the current or voltage output of a single TPS cell.

Other potential advantages of the TPS cell-based touch sensor devices are that these devices may also generate alternative light channels operational in the dark when no light source is available to serve as an emergency or auxiliary light source to TPS cell-based touch sensors to work. Furthermore, in order for some implementations of the TPS cell-based touch sensor devices disclosed herein to work properly when the TPS cell-based touch sensor is placed in the dark or in a setting in which adequate ambient light is lacking, artificially created synthetic light may be generated using edge-lit light channels.

In places where the description above refers to particular implementations of voltage varying devices such as TPS cells used as touch sensors and alternative energy sources, it should be readily apparent that a number of modifications may be made without departing from the spirit thereof and that these implementations may be applied to other to systems and techniques for touch sensing and alternative energy sources.

The invention claimed is:

1. A method of creating a touch sensitive surface comprising:

detecting a plurality of voltage changes in a plurality of transparent photovoltaic solar cells from among an array of transparent photovoltaic solar cells that comprise a touch sensitive surface of a device comprising an input device on top of a display other than a capacitive touch sensor, in response to a lack of energy within a non-visible light spectrum reaching the plurality of transparent photovoltaic solar cells when a user contacts the touch sensitive surface;

generating a plurality of location coordinates corresponding to a plurality of locations in the array at which the plurality of voltage changes occurred;

determining one or more location coordinates from among the plurality of location coordinates corresponding to a voltage change that exceeds a predetermined threshold, the predetermined threshold being an average voltage of the plurality of transparent photovoltaic solar cells, wherein the predetermined threshold is dynamically adjusted based on an amount of ambient light present;

scanning, by a processor, a voltage of the transparent photovoltaic solar cells that are among the array of transparent photovoltaic solar cells;

identifying, by the processor, a malfunctioning transparent photovoltaic solar cell in response to detecting a voltage drop for a longer duration than is typical of an intentional touch by a user; and transmitting the one or more location coordinates of the intentional touch by the user to a processor configured to process a touch command received by the touch sensitive surface without processing a touch command associated with one or more location coordinates at which the malfunctioning transparent photovoltaic solar cell is located.

2. The method of claim 1, wherein the touch sensitive surface is located on a handheld computerized device.

3. The method of claim 1, wherein the lack of energy within the non-visible light spectrum reaching the at least one of the transparent photovoltaic solar cells is caused by an obstruction of light by at least one of a digit of a user's hand, a stylus, or a glove.

4. A touch sensitive surface comprising:

a plurality of touch sensitive voltage varying devices (VVD) configured to form a grid on top of a display other than a capacitive touch sensor;

a voltage detector configured to measure a change in a voltage of more than one VVD within a touch area on the grid when a user touches the touch sensitive surface; and a processor configured to;

calculate an average voltage of the plurality of VVDs and process a touch command received by the touch sensitive surface in response to an intentional touch of the touch sensitive surface by a user in response to a voltage drop that exceeds a predetermined threshold in the touch area of the grid that corresponds with a location of the touch area in which the voltage drop occurred, wherein the predetermined threshold is the average voltage of the plurality of VVDs and is dynamically adjusted based on an amount of ambient light present;

scan a voltage of the VVD's that are among the plurality of VVD's;

identify a malfunctioning VVD in response to detecting a voltage drop for a longer duration than is typical of the intentional touch by the user; and process a touch command received by the intentional touch of the touch sensitive surface by the user without processing a touch command associated with one or more location coordinates at which the identified malfunctioning VVD is located.

5. The touch sensitive surface of claim 4, wherein at least one of the VVD's changes voltage without an external voltage or current being applied.

6. The touch sensitive surface of claim 4, wherein the VVD's are analog or digital electrical circuits that measure absolute voltage.

7. The touch sensitive surface of claim 4, wherein the VVDs are transparent photovoltaic solar cells that are configured to receive input energy from a solar or synthetic light energy source.

8. The touch sensitive surface of claim 4, wherein at least a portion of the plurality of VVDs remain operational in the event of a failure of one or more VVDs among the plurality of VVDs.

9. A touch sensitive surface comprising:
  a plurality of transparent photovoltaic solar cells configured in an array forming an input device on top of a display of a device that is other than a capacitive touch sensor;
  a voltage detector configured to detect a plurality of voltage changes at a plurality of locations in the array that is caused by a user touching the touch sensitive surface;
  a processor configured to:
    calculate a plurality of location coordinates corresponding to the plurality of locations in the array in response to the plurality of voltage changes detected;
    determine one or more location coordinates from among the plurality of location coordinates corresponding to a voltage change that exceeds a predetermined threshold, wherein the predetermined threshold is dynamically adjusted based on an amount of ambient light present;
    scan a voltage of the transparent photovoltaic solar cells that are among the array;
    identify a malfunctioning transparent photovoltaic solar cell in response to detecting a voltage drop for a longer duration than is typical of an intentional touch by a user; and
    process a touch command corresponding to the location in the array associated with the one or more location coordinates in response to the intentional touch of the touch sensitive surface by the user without processing a touch command associated with one or more location coordinates at which the identified malfunctioning transparent photovoltaic solar cell is located;
  a recharging circuit configured to recharge a battery coupled to the recharging circuit using voltages produced by the touch sensors; and
  a unidirectional device configured to prevent backward current flow from adjacent touch sensors resulting from the voltage drop at the location in the array corresponding to the one or more location coordinates.

10. The touch sensitive surface of claim 9, wherein the unidirectional device comprises a diode.

11. The touch sensitive surface of claim 9, wherein the plurality of transparent photovoltaic solar cells is electrically connected in at least one of a parallel and series configuration such that total current and voltage outputs are greater than a current and voltage output of a single transparent photovoltaic solar cell.

12. The touch sensitive surface of claim 11 further comprising a combiner circuit configured to combine voltages produced by the plurality of transparent photovoltaic solar cells in such that energy continues to be generated in the event of a failure of a transparent photovoltaic solar cell in the array.

13. The touch sensitive surface of claim 9, wherein by at least one of a digit of a user's hand, a stylus, or a glove is used to touch the touch sensitive surface.

14. The touch sensitive surface of claim 9, wherein the voltage change occurs without an external voltage or current being applied.

* * * * *